United States Patent
Chen et al.

(10) Patent No.: US 7,107,364 B2
(45) Date of Patent: Sep. 12, 2006

(54) CONTROL CHIP FOR OPTICAL DISK DRIVE AND METHOD FOR UPDATING FIRMWARE IN THE CONTROL CHIP

(75) Inventors: Ping-Sheng Chen, Chia Yi (TW); Hung-Cheng Kuo, Hsinchu (TW)

(73) Assignee: MediaTek Inc., Hsin Chu (TW)

( * ) Notice: Subject to any disclaimer, the term of this patent is extended or adjusted under 35 U.S.C. 154(b) by 230 days.

(21) Appl. No.: 10/718,547

(22) Filed: Nov. 24, 2003

(65) Prior Publication Data
US 2004/0133711 A1    Jul. 8, 2004

(30) Foreign Application Priority Data
Jan. 3, 2003   (TW) ............................... 92100208 A

(51) Int. Cl.
*G06F 12/00*   (2006.01)
*G06F 13/10*   (2006.01)
(52) U.S. Cl. ...................... 710/22; 710/2; 710/3; 710/4; 710/5; 710/8; 710/33; 711/103; 711/111; 711/112; 711/158
(58) Field of Classification Search ............... 710/2–5, 710/22, 33, 8; 711/103, 111, 112, 158
See application file for complete search history.

(56) References Cited

U.S. PATENT DOCUMENTS

| 6,170,043 | B1 | 1/2001 | Hu |
| 6,289,397 | B1 * | 9/2001 | Tsuyuguchi et al. ........... 710/1 |
| 6,357,021 | B1 * | 3/2002 | Kitagawa et al. ............. 714/41 |
| 6,507,881 | B1 * | 1/2003 | Chen .......................... 710/305 |
| 6,523,083 | B1 * | 2/2003 | Lin et al. ..................... 711/103 |
| 2003/0041182 | A1 * | 2/2003 | Martwick ....................... 710/1 |

* cited by examiner

*Primary Examiner*—Tammara Peyton
(74) *Attorney, Agent, or Firm*—Birch, Stewart, Kolasch & Birch, LLP.

(57) ABSTRACT

A control chip for updating firmware in an optical disk drive by hardware. The control chip includes a microprocessor for controlling actions of the optical disk drive, a decoder controlled by the microprocessor and connected to an external buffer memory and a host interface, a controller controlled by the microprocessor and connected to the decoder to receive control signals and data of the optical disk drive, an extra memory connected to the microprocessor for storing an update program routine, a DMA unit controlled by the microprocessor to read data from the external buffer memory, and a macro unit controlled by the microprocessor to receive data output from the DMA unit and to write the data into the non-volatile memory. Because the firmware is updated into the flash memory in the hardware architecture, the speed is fast and the microprocessor can execute other works while updating.

5 Claims, 6 Drawing Sheets

CONTROL CHIP FOR OPTICAL DISK DRIVE AND METHOD FOR UPDATING FIRMWARE IN THE CONTROL CHIP

This Nonprovisional application claims priority under 35 U.S.C. § 119(a) on patent Application No(s). 092100208 filed in Taiwan on Jan. 3, 2003, the entire contents of which are hereby incorporated by reference.

BACKGROUND OF THE INVENTION

1. Field of the Invention

The invention relates to a control chip for an optical disk drive and a method for updating firmware in the control chip, and more particularly to a control chip for an optical disk drive, which executes firmware update actions by a macro unit and a DMA (Direct Memory Access) unit, and a method for updating firmware in the control chip.

2. Description of the Related Art

FIG. 1 shows a control architecture diagram of a typical optical drive, such as a CD-ROM. As shown in FIG. 1, the optical drive 10 utilizes an optical pickup, which is disposed in a sled motor and pickup assembly 102, to retrieve data stored in an optical disk 100 and then output a radio frequency (RF) signal. An RF amplifier and controller 110 is used to receive and amplify the RF signal and to output a amplified signal to a decoder 114. The decoder 114 receives the amplified signal and decodes the amplified signal to generate decoded data. The decoded data are then stored in a buffer memory 116. A microprocessor 112 is used to control operations and functions of the optical drive 10. For instance, the microprocessor 112 is used to control the RF amplifier and controller 110 and the decoder 114, to drive the spindle motor 101, the sled motor and optical head assembly 102, and the like. The microprocessor 112 is further connected to a non-volatile memory 118 to read firmware information, such as update program routines and commands to control and operate the optical drive 10. Users can utilize a host 122 to read the data in the buffer memory 116 via a host interface 120.

Because the computer industry is rapidly developed, hardware peripherals, such as optical drive, are also rapidly developed. In order to continuously update the function and operation of the optical drive, the firmware stored in the non-volatile memory is typically updated. Generally, when the firmware of the optical drive is updated, the update program routine being executed and the data being updated are stored in the non-volatile memory. However, this method reduces the usable space in the non-volatile memory and lengthens the time for updating the firmware.

In addition, U.S. Pat. No. 6,170,043, entitled "Method for controlling an optic disk" disclosed another update method. FIG. 2 shows an architecture diagram of the control chip in this patent. The control chip 200 includes an extra memory 202, a microprocessor 204, a decoder 206, and a controller 208. In the method disclosed in this patent application, when the firmware is to be updated, the update program routine is stored in the extra memory 202 and a flash ROM (non-volatile memory) 210 is regarded as a data storage space. In this method, the usable space in the non-volatile memory 210 is not occupied, and the speed for updating the firmware may be increased. However, this method has the following drawbacks. That is, since the microprocessor executes the operation of either reading the update program routine or writing the data in the non-volatile memory by software, the microprocessor cannot perform other works, such as accessing the data of the host, when the data are written. In addition, it takes longer time for the microprocessor to execute the software to compute the address of the extra memory.

SUMMARY OF THE INVENTION

In view of the above-mentioned problems, it is therefore an object of the invention to provide a control chip, which has a macro unit, for an optical disk drive and a method for updating firmware in the control chip. The update control of the firmware is performed using the macro unit by means of hardware control.

To achieve the above-mentioned object, the control chip for an optical disk drive includes a microprocessor for controlling actions of the optical disk drive, a decoder controlled by the microprocessor and connected to an external buffer memory and a host interface, a controller controlled by the microprocessor and connected to the decoder to receive control signals and data of the optical disk drive, an extra memory for storing an update program routine of the microprocessor and being connected to the microprocessor, a DMA unit controlled by the microprocessor to read data of the external buffer memory, and a macro unit controlled by the microprocessor to receive data output from the DMA unit and to write the data into the non-volatile memory.

When the control chip is updating the update program routine of the non-volatile memory, the extra memory serves as a buffer for the update program routine of the microprocessor, and the microprocessor outputs the control signals to the DMA unit and the macro unit. Data in the buffer memory is written to the non-volatile memory using the macro unit and the DMA unit by hardware.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The control chip for an optical disk drive and a method for updating firmware in the control chip of the invention will be described with reference to the accompanying drawings.

Figure 1:
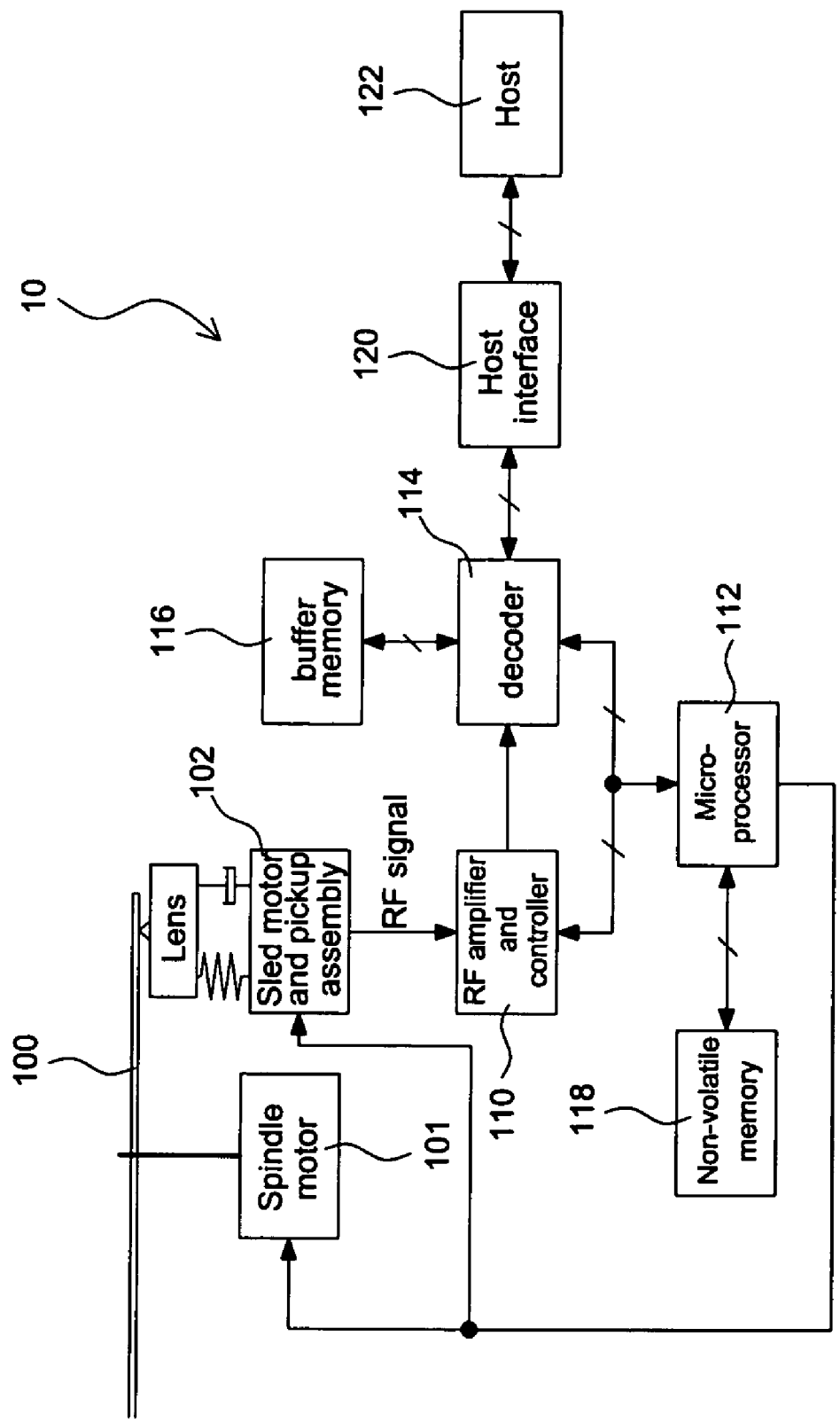
FIG. 1 shows a control architecture diagram of a typical optical drive.
Figure 2:
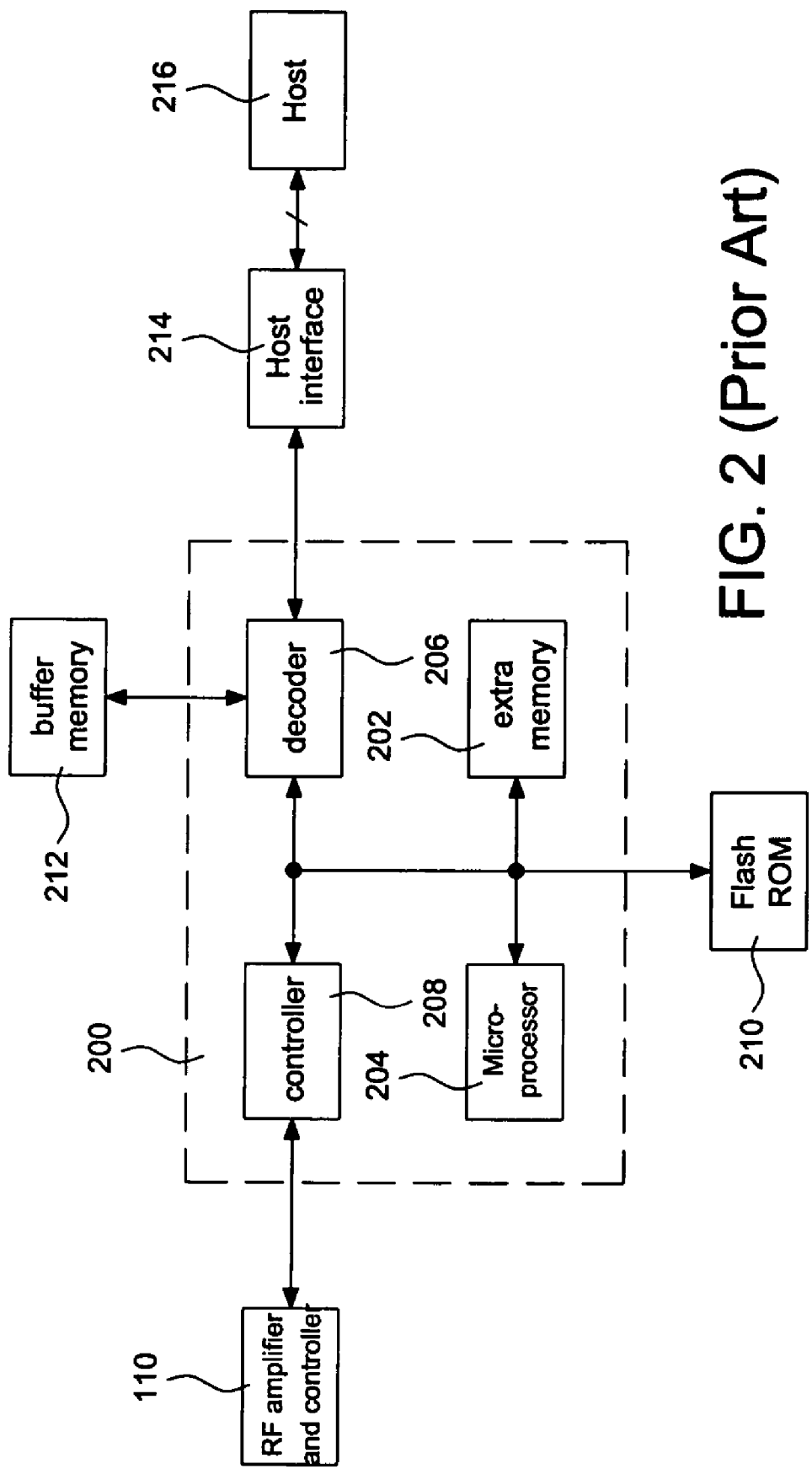
FIG. 2 shows an architecture diagram of a control chip in a conventional optical disk drive.
Figure 3:
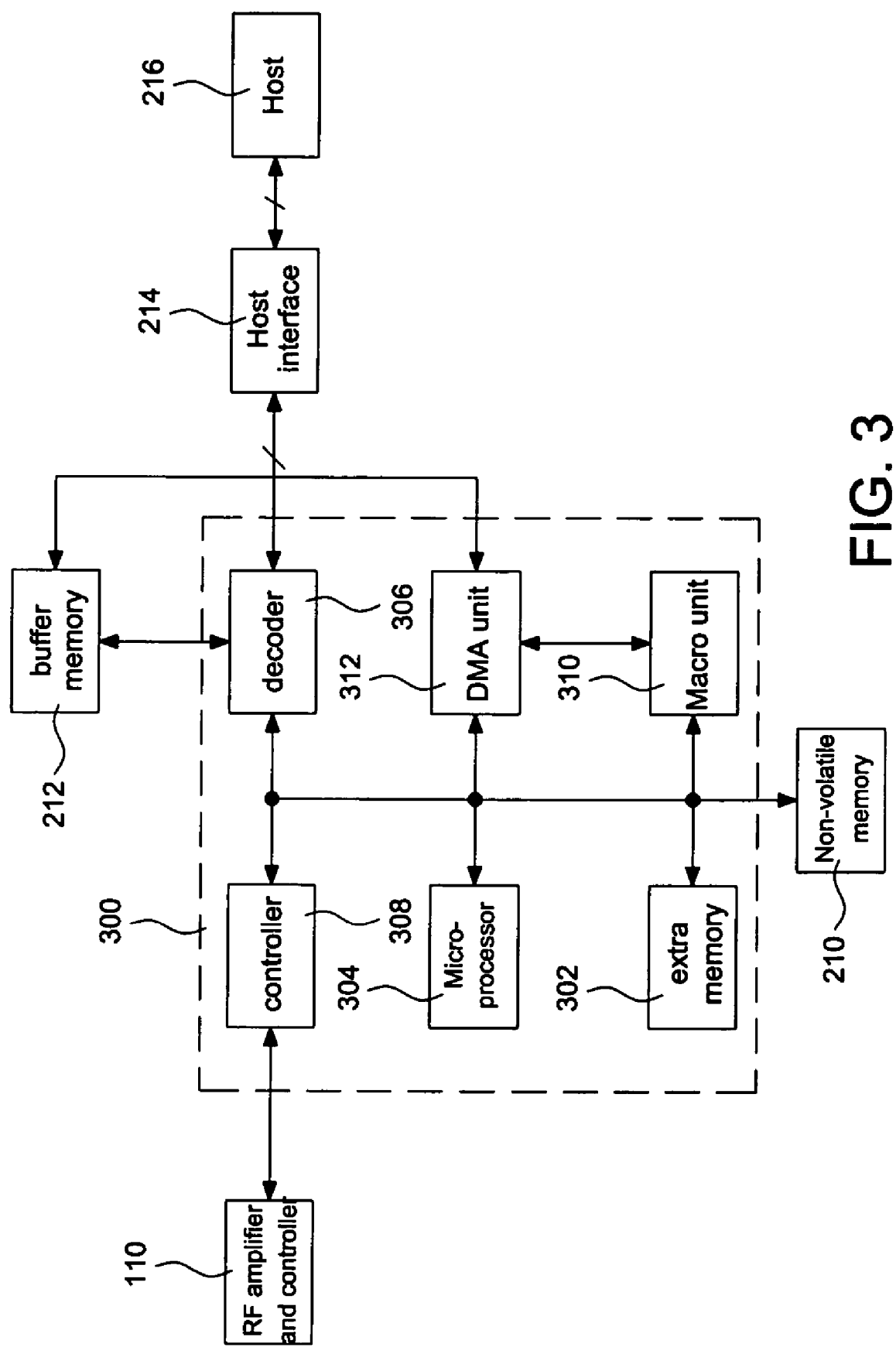
FIG. 3 shows an architecture diagram of a control chip for an optical disk drive of the invention.

FIG. 3 shows an architecture diagram of a control chip for an optical disk drive of the invention. Referring to FIG. 3, the control chip 300 includes an extra memory 302, a microprocessor 304, a decoder 306, a controller 308, a macro unit 310 and a DMA unit 312. The control chip 300 has the function of updating the firmware in the optical disk drive, wherein the firmware is stored in the non-volatile memory 210. The non-volatile memory 210 may be a flash memory (flash ROM) or an electrically erasable and programmable non-volatile memory (EEPROM). As shown in FIG. 3, the macro unit 310 and the DMA unit 312 are not included in the conventional control chip for the optical disk drive, and other elements including the extra memory 302, the microprocessor 304, the decoder 306, and the controller 308 are the same as those of the conventional control chip for the optical disk drive as shown in the architecture diagram of FIG. 2.

The macro unit 310, which is controlled by the microprocessor 304, reads data in the buffer memory 212 via the DMA unit 312 when the firmware is updated, and writes the read data to the non-volatile memory 210 in a specific command sequence, such as an erase command, a read command, a write command, a compare command, and the like. The DMA unit 312, which is also controlled by the microprocessor 304, transfers the data in the buffer memory 212 to the macro unit 310 when the firmware is updated.

When the optical disk drive is updating the firmware, the optical disk drive temporarily stores an update program routine to be executed by the microprocessor 304 in the extra memory 302, and the firmware to be updated in the buffer memory 212. Thus, when the optical disk drive is updating the firmware, the microprocessor 304 executes the update program routine stored in the extra memory 302 and outputs control signals to the macro unit 310 and the DMA unit 312 so as to execute the update action of the firmware through the macro unit 310 and the DMA unit 312. When the macro unit 310 is executing the update action, the microprocessor 304 only needs to monitor the interior state of the macro unit 310. Thus, the microprocessor 304 may execute other actions with the host 216 at other time. Because the macro unit 310 and the DMA unit 312 read and write data by hardware when the macro unit 310 and the DMA unit 312 are executing the update action of firmware, the executing speed is faster than that by calculating addresses by software.

The optical disk drive is switched to a firmware update mode, when the control chip is updating firmware into the non-volatile memory, other the optical disk drive is switched to a normal operation mode. In general, after the computer is booted and reset, the microprocessor 204 of the optical disk drive will initialize the optical disk drive, such as CD-ROM, and wait for the command of the host computer 216 requesting to read data from the disk 100. After the host computer 216 issues a command to request reading data of the disk 100, the microprocessor 304 outputs correct parameters to control the controller 308 and the decoder 306 in order to drive the motor and the optical pickup in the optical disk drive to read the data stored in the disk 100. The data in the disk 100 is decoded and corrected by the decoder 306, and is then stored in the buffer memory (DRAM) 212. Consequently, the computer 216 can read the data in the buffer memory 212 by the decoder 306 via a host interface 214. At this time, the extra memory 302 serves as a memory space for the general data, while the non-volatile memory 210 serves as a memory space for the update program routine of the system.

Figure 4:
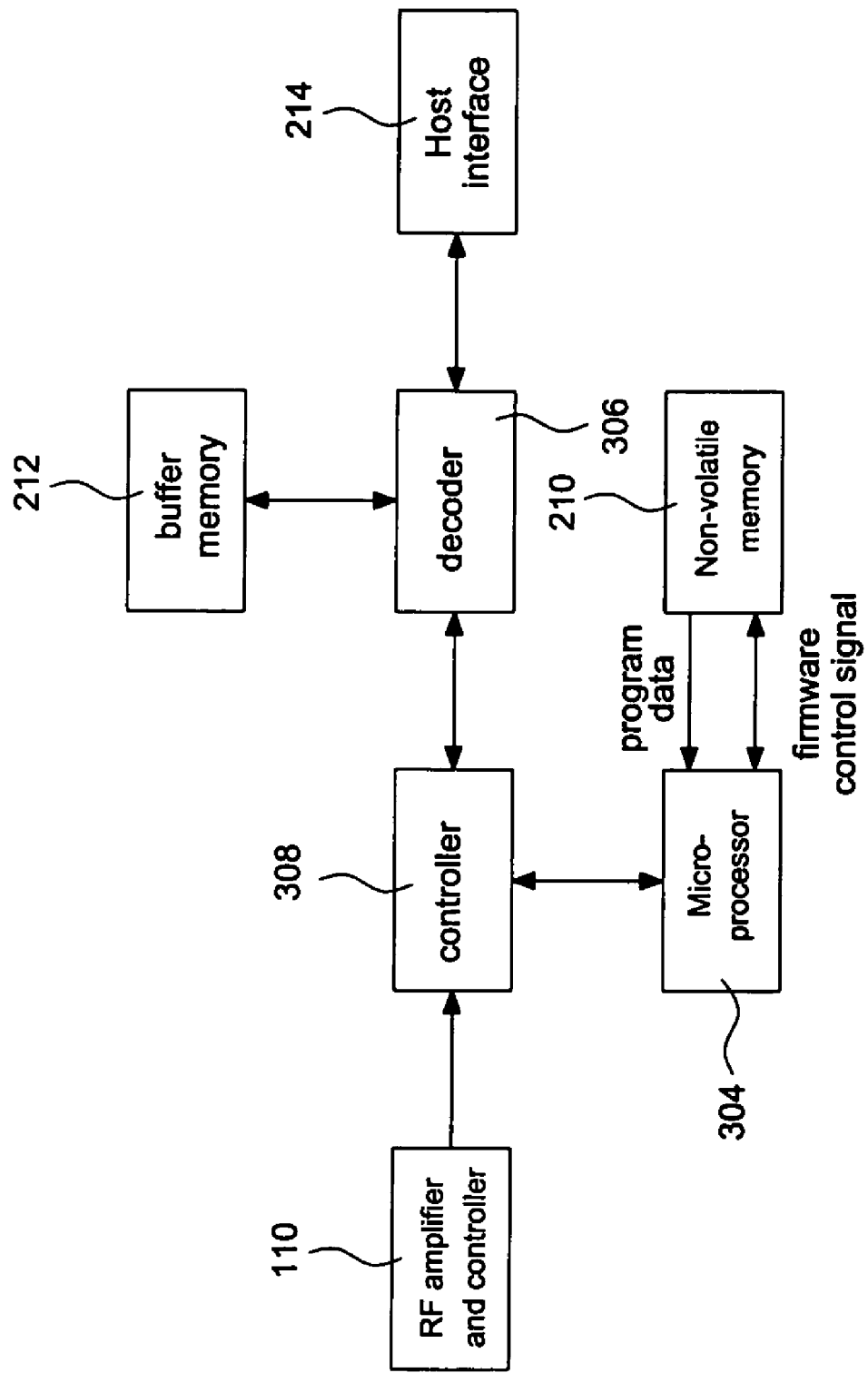
FIG. 4 shows the data flow in the control chip for the optical disk drive of the invention in a normal operate mode.

FIG. 4 shows the data flow in the control chip for the optical disk drive of the invention in a normal operate mode. As shown in FIG. 4, the non-volatile memory 210 of the optical disk drive serves as the storage space for the update program routine in the normal operation mode, and the microprocessor 304 outputs the firmware control signal to the non-volatile memory 210 so as to read the program of the update program routine of the non-volatile memory 210 to control the actions of the optical disk drive. Therefore, the macro unit 310 and the DMA unit 312 are under the idle states in the normal operation mode. In the normal operation mode, the actions of the control chip for an optical disk drive are the same as those of the prior art, and detailed description thereof will be omitted.

When the optical disk drive will update the firmware of the non-volatile memory 210, the update program routine of the special format data similar to a TOC (Table of Content) may be stored in a disk, which is placed in the optical disk drive. Alternately, the host computer 216 executes certain specific software for the update program routine. The content of the update program routine includes program codes and an update program routine. At this time, the extra memory 302 stores the update program routine loaded from the disk 100 or the computer 216, and the program codes are stored in the buffer memory 212.

Figure 5:
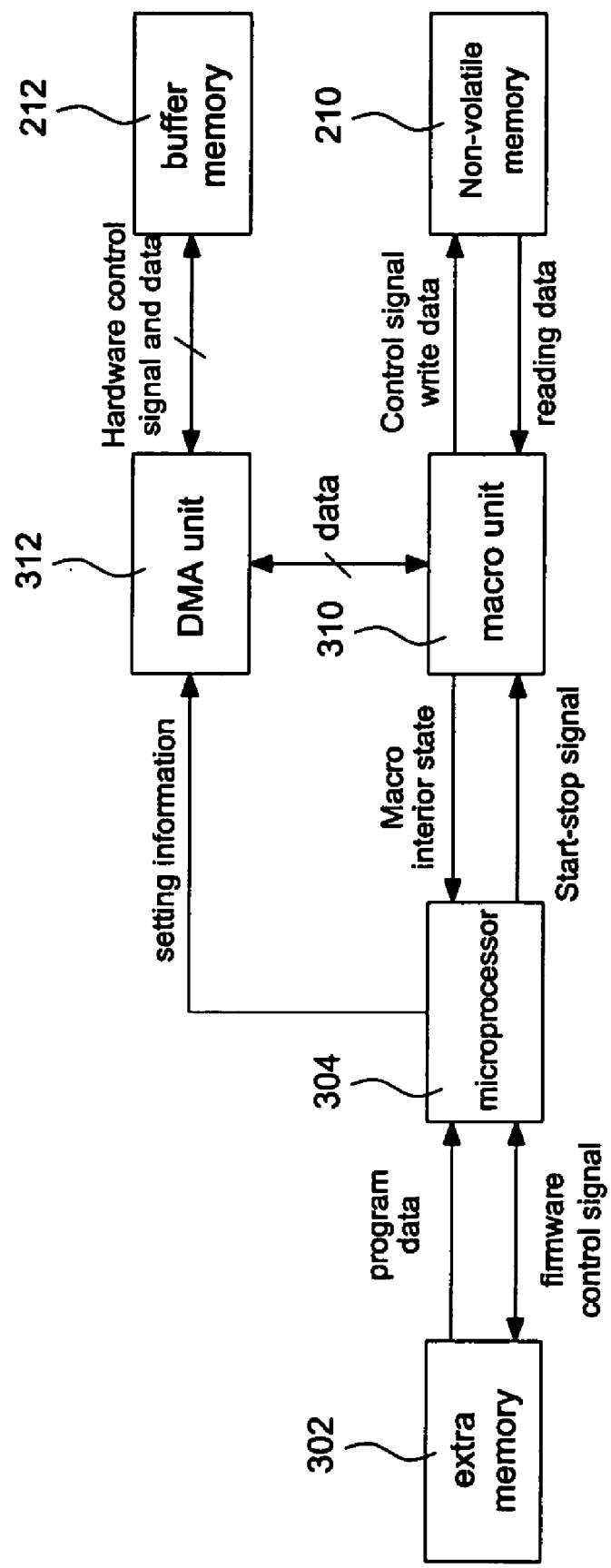
FIG. 5 shows the data flow in the control chip for an optical disk drive of the invention in a data update mode.

FIG. 5 shows the data flow in the control chip for an optical disk drive of the invention in a firmware update mode. As shown in FIG. 5, when the optical disk drive is switched to the firmware update mode, the extra memory 302 of the optical disk drive serves as a storage position for the update program routine, and the microprocessor 304 reads the update program routine command from the extra memory 302 to control the actions of the DMA unit 312 and the macro unit 310. That is, at the beginning of the firmware updating, the microprocessor 304 reads the update program routine command from the extra memory 302, calculates the length of the to-be-updated program codes and the start position of the program codes in the buffer memory 212, and outputs the setting information to the DMA unit 312. Thereafter, the microprocessor 304 outputs an initialization signal to the macro unit 310 to start reading the program codes in the buffer memory 212 via the DMA unit 312, and writing the program codes into the non-volatile memory 210. The DMA unit 312 sequentially reads the program codes from the buffer memory 212 according to the start position and the length generated from the microprocessor 304, and output the program codes to the macro unit 310. Thus, when the optical disk drive is updating the firmware codes, the microprocessor 304 is not necessary to compute the address of the buffer memory 212. In addition, when the macro unit 310 is writing program codes to the non-volatile memory 210, the microprocessor 304 may momentarily monitor the interior state of the macro unit 310 and output a stop signal to the macro unit 310 and the DMA unit 312 when the firmware updating process is finished.

The actions of the macro unit 310 includes reading program codes from the DMA unit 312, outputting the address, the program codes, and write control signals to the non-volatile memory 210.

Figure 6:
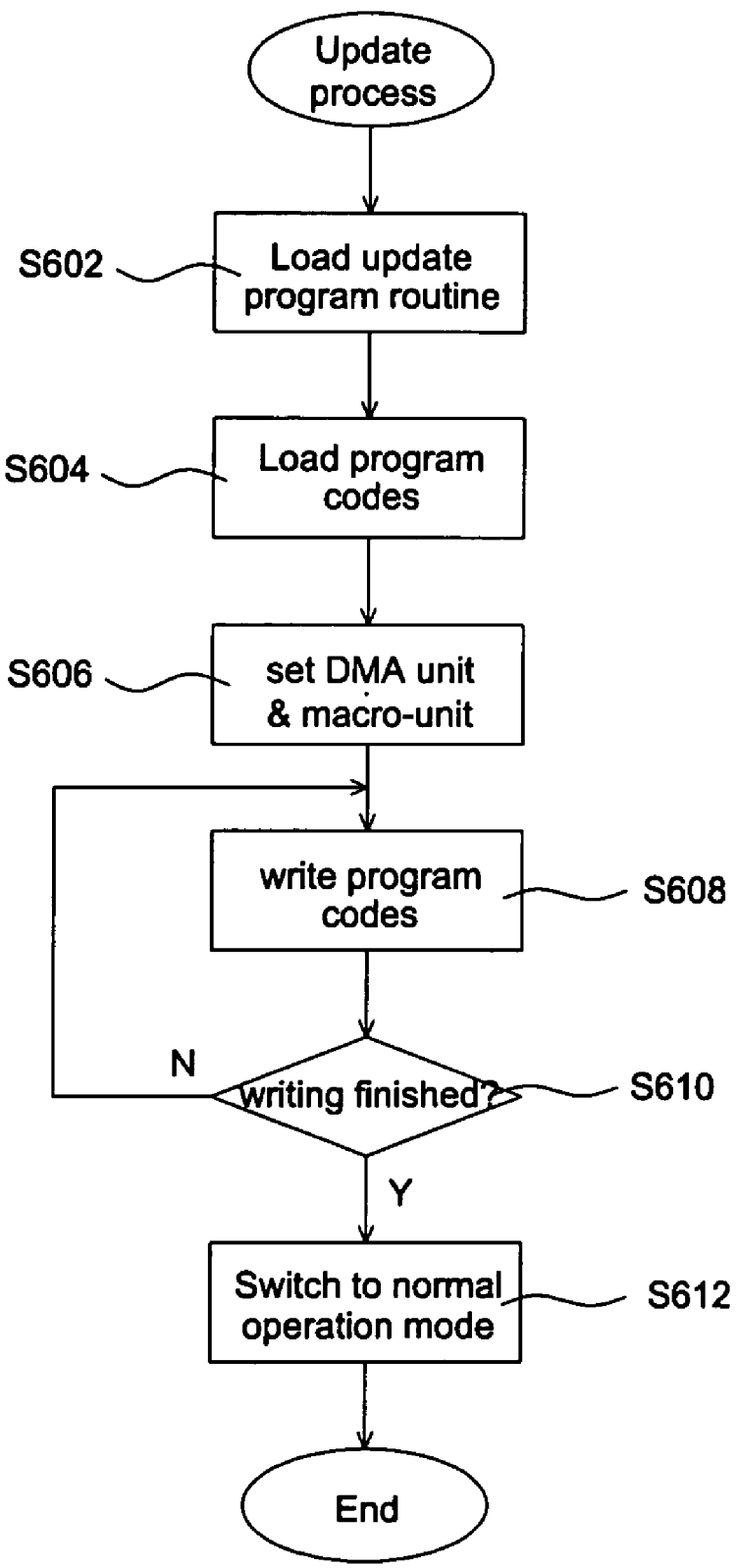
FIG. 6 shows a flow chart in the control chip for an optical disk drive of the invention in a firmware update mode.

FIG. 6 shows a flow chart in the control chip for an optical disk drive of the invention in a firmware update mode. Referring to FIG. 6, the method for the control chip to update firmware in the optical disk drive in the firmware update mode includes the following steps.

Step S602: load an update program routine. The step is controlled by the microprocessor 304 or the host 216 to load the update program routine to the extra memory 302. Thus, the microprocessor 304 can execute the update program routine of the extra memory 302 during the update action.

Step S604: load program codes. The step is controlled by the microprocessor 304 or the host 216 to load the to-be-updated program codes (firmware) to the buffer memory 212.

Step S606: set the DMA unit 312 and the macro unit 310. The microprocessor 304 computes the start position of the program codes in the buffer memory 212 and the total length of the program codes, and transfers the setting information, including start position and length, to the DMA unit 312. In addition, the destination starting address of the non-volatile memory 210 is set in the macro unit 310.

Step S608: execute a program code write action. The microprocessor 304 generates and outputs an initialization signal to the macro unit 310 and the DMA unit 312. After the macro unit 310 and the DMA unit 312 receive the initialization signal, the DMA unit 312 reads the program codes from the buffer memory 212 and transfers them to the macro unit 310, which writes the program codes into the non-volatile memory 210.

Step S610: monitor the state of the macro unit. The microprocessor 304 monitors the interior state of the macro unit 310 so as to control the actions of the macro unit 310 at proper timing of, for example, when the macro unit 310 has an error or when the writing of the program codes is finished.

Step S612: switch the mode to a normal operation mode. When the writing of the program codes is finished, the microprocessor 304 generates a stop signal to the macro unit 310 and the DMA unit 312 so as to stop the actions of the macro unit 310 and the DMA unit 312 and to switch the mode to the normal operation mode.

In the above-mentioned step S608, because the writing action of the program codes is hardware-controlled by the macro unit 310 and the DMA unit 312, the speed is faster than that by software-calculating the address. Moreover, because the writing action of program codes is hardware-controlled by the macro unit 310 and the DMA unit 312, the microprocessor 304 can execute other works in addition to monitoring the state of the macro unit 310. For instance, the microprocessor 304 may transfer data via the host interface 214 and the host 216, or report the writing progress and state.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A control chip capable of updating data in a non-volatile memory in an optical disk drive, the control chip comprising:

a microprocessor for controlling actions of the optical disk drive;

a decoder controlled by the microprocessor and connected to an external buffer memory and a host interface;

a controller controlled by the microprocessor and connected to the decoder for receiving a control signal and data from the optical disk drive;

an extra memory connected to the microprocessor for receiving an update program routine or normal data of the microprocessor;

a DMA unit controlled by the microprocessor for reading the data from the external buffer memory; and a macro unit controlled by the microprocessor for receiving data output from the DMA unit and writing the data into a non-volatile memory;

wherein, when the control chip updates the data in the non-volatile memory, the extra memory serves as a buffer memory for the update program routine of the microprocessor, and the microprocessor outputs the control signal to the DMA unit and the macro unit, and the data in the buffer memory is written into the non-volatile memory using the macro unit and the DMA unit in a hardware manner.

2. The control chip according to claim 1, wherein the non-volatile memory is a flash memory.

3. The control chip according to claim 1, wherein when the control chip updates data in the non-volatile memory, the microprocessor outputs a start position and a data length in the buffer memory to the DMA unit.

4. The control chip according to claim 3, wherein when the control chip updates data in the non-volatile memory, the microprocessor outputs a start writing signal and a stop writing signal to the macro unit.

5. The control chip according to claim 4, wherein when the control chip updates data in the non-volatile memory, the microprocessor receives an interior state signal of the macro unit to monitor actions of the macro unit.

\* \* \* \* \*